(12) United States Patent
Fassnacht et al.

(10) Patent No.: US 11,072,299 B2
(45) Date of Patent: Jul. 27, 2021

(54) METHOD FOR DETERMINING AN ELECTRICAL CAPACITANCE IN AN INTERMEDIATE CIRCUIT OF AN ELECTRIC DRIVE SYSTEM

(71) Applicant: Robert Bosch GmbH, Stuttgart (DE)

(72) Inventors: Jochen Fassnacht, Calw (DE); Tunan Shen, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/775,855

(22) Filed: Jan. 29, 2020

(65) Prior Publication Data

US 2020/0238931 A1    Jul. 30, 2020

(30) Foreign Application Priority Data

Jan. 30, 2019    (DE) .......................... 102019201151.9

(51) Int. Cl.
| | |
|---|---|
| B60R 16/03 | (2006.01) |
| G01R 27/26 | (2006.01) |
| G05B 11/36 | (2006.01) |
| G01R 31/64 | (2020.01) |
| G01R 31/01 | (2020.01) |
| G01R 31/00 | (2006.01) |

(52) U.S. Cl.
CPC .......... B60R 16/03 (2013.01); G01R 27/2605 (2013.01); G01R 31/64 (2020.01); G05B 11/36 (2013.01); *G01R 31/007* (2013.01); *G01R 31/016* (2013.01)

(58) Field of Classification Search
CPC .......................... G01R 27/2605; G01R 31/006; G01R 31/007; G01R 31/016; G01R 31/64; B60L 3/0046; B60R 16/03
See application file for complete search history.

(56) References Cited

U.S. PATENT DOCUMENTS

| | | | | |
|---|---|---|---|---|
| 8,723,527 | B2 * | 5/2014 | Kudo ................. | G01R 31/3648 |
| | | | | 324/433 |
| 9,684,037 | B2 * | 6/2017 | Hardy ................. | G06Q 20/145 |
| 10,569,800 | B2 * | 2/2020 | Terdy .................... | B62D 5/046 |
| 2013/0278190 | A1 | 10/2013 | Fink | |
| 2018/0054151 | A1 | 2/2018 | Matsumoto et al. | |

FOREIGN PATENT DOCUMENTS

| | | | | |
|---|---|---|---|---|
| DE | 102013211567 A1 * | 12/2014 | ............ | B60L 3/0046 |
| DE | 102013211567 A1 | 12/2014 | | |
| DE | 102015204220 A1 | 9/2016 | | |

* cited by examiner

*Primary Examiner* — Ryan Johnson

(74) *Attorney, Agent, or Firm* — Norton Rose Fulbright US LLP; Gerard Messina

(57) ABSTRACT

A method for determining an electrical capacitance in an intermediate circuit of an electric drive system. The electric drive system includes at least one first electrical energy source, which feeds the intermediate circuit, a drive unit, which has an inverter and an electrical load, the inverter being electrically connected on the input side with the intermediate circuit and on the output side with the electrical load, and a DC voltage converter, which is electrically connected with the intermediate circuit and measures a voltage in the intermediate circuit by high frequency sampling. The electrical capacitance in the intermediate circuit is determined from the voltage in the intermediate circuit measured by the DC voltage converter. Also described is a motor vehicle, which includes an electric drive system for implementing the method.

18 Claims, 1 Drawing Sheet

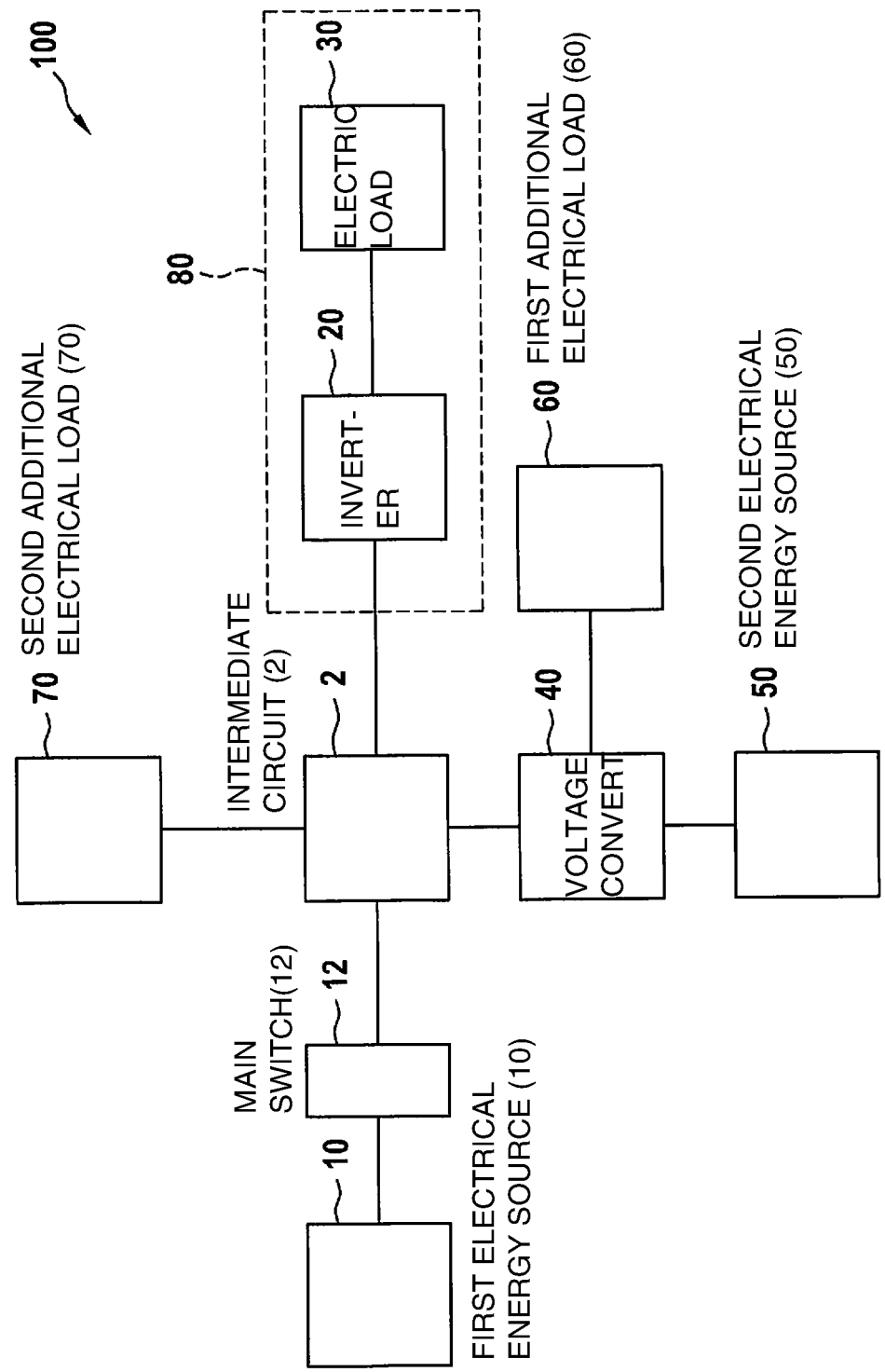

METHOD FOR DETERMINING AN ELECTRICAL CAPACITANCE IN AN INTERMEDIATE CIRCUIT OF AN ELECTRIC DRIVE SYSTEM

RELATED APPLICATION INFORMATION

The present application claims priority to and the benefit of German patent application no. DE 10 2019 201 151.9, which was filed in Germany on Jan. 30, 2019, the disclosure of which is incorporated herein by reference.

FIELD OF THE INVENTION

The present invention relates to a method for determining an electrical capacitance in an intermediate circuit of an electric drive system. The electric drive system in this context comprises at least one first electrical energy source, which feeds the intermediate circuit, a drive unit, which has an inverter and an electrical load, the inverter being electrically connected on the input side with the intermediate circuit and on the output side with the electrical load, and a DC voltage converter, which is electrically connected with the intermediate circuit and measures a voltage in the intermediate circuit by high frequency sampling. The present invention further relates to a motor vehicle, which comprises an electric drive system, which is configured for implementing the method of the present invention.

BACKGROUND INFORMATION

It seems likely that electrically driven motor vehicles will be utilized increasingly in the future. Such electrically driven motor vehicles such as e.g. electric vehicles and hybrid vehicles, respectively comprise an electric drive system, which has an intermediate circuit as well as multiple electric units electrically connected directly or indirectly to the intermediate circuit. The intermediate circuit comprises multiple intermediate circuit capacitors, which are respectively assigned to an electric unit that is directly electrically connected to the intermediate circuit.

The above-mentioned electric units, which are directly electrically connected to the intermediate circuit, include for example an inverter, in particular a pulse-controlled inverter, for controlling and driving electric motors such as traction motors, and a DC voltage converter for converting the direct voltage supplied at the input into a direct voltage having a higher, lower or inverted voltage level.

The intermediate circuit capacitors, in particular the intermediate circuit capacitor associated with the inverter, are normally oversized for various reasons such as e.g. manufacturing precision, capacitance drift at high temperature and aging. For this reason, it is not necessary to monitor the state of the intermediate circuit capacitors, which monitoring would ascertain for example the current electrical capacitance in the intermediate circuit or the intermediate circuit capacitors, in particular of the intermediate circuit capacitor associated with the inverter.

Document US 2013/278190 A1 discloses a method for setting a DC voltage intermediate circuit voltage as well as a battery and a battery system having a direct current voltage intermediate circuit, which are configured to implement the method.

Document US 2018/054151 A1 discloses an electrical power adaptation system, in which the properties of a ripple current are modified by changing a number of driver phases and/or a voltage ratio of a multi-phase converter, and a control method for the electrical power adaptation system.

SUMMARY OF THE INVENTION

A method is provided for determining an electrical capacitance in an intermediate circuit of an electric drive system. The electric drive system in this context comprises at least one first electrical energy source, which feeds the intermediate circuit, a drive unit, which has an inverter and an electrical load, the inverter being electrically connected on the input side with the intermediate circuit and on the output side with the electrical load, and a DC voltage converter, which is electrically connected with the intermediate circuit and measures a voltage in the intermediate circuit by high frequency sampling.

The DC voltage converter for this purpose has an apparatus/device for measuring the voltage in the intermediate circuit. The apparatus/device may be embodied for example as an A/D converter (analog-digital converter). The frequency of the sampling may be greater than 10 kHz.

According to the present invention, the electrical capacitance in the intermediate circuit is determined on the basis of the voltage in the intermediate circuit measured by the DC voltage converter.

The electric drive system furthermore may have at least one second electrical energy source, which is electrically connected via the DC voltage converter to the intermediate circuit and has a different voltage level than that of the first electrical energy source. The first electrical energy source may have a higher voltage level than the second electrical energy source.

The electric drive system may comprise further electric units. The electric drive system may comprise for example a first additional electrical load, which has one or multiple electric units and is electrically connected to the intermediate circuit via the DC voltage converter, and a second additional electrical load, which has one or multiple electric units and is electrically connected directly to the intermediate circuit.

The intermediate circuit in this case has multiple intermediate circuit capacitors, which are respectively assigned to an electric unit that is directly electrically connected to the intermediate circuit. For example, the intermediate circuit comprises intermediate circuit capacitors, which are respectively assigned to the inverter, the DC voltage converter and possibly also to the second electrical load.

The first and second energy sources may be developed as energy stores, such as for example a battery, in particular a lithium-ion battery (LIB), a super capacitor (SC) or hybrid super capacitor (HSC) or as an energy converter, such as a fuel cell for example.

According to one advantage development of the present invention, the method of the invention comprises the following steps:
  detecting a ripple in the voltage in the intermediate circuit when measuring the voltage in the intermediate circuit using the DC voltage converter;
  measuring a current of the electrical load;
  emulating a ripple of an input current of the inverter on the basis of the measured current of the electrical load and with the aid of a model of the drive unit;
  determining the electrical capacitance in the intermediate circuit on the basis of the detected ripple of the voltage in the intermediate circuit and the emulated ripple of the input current of the inverter with the aid of a dynamic intermediate circuit model.

For this purpose, the measured values of the current of the electrical load serve as a starting point for the model of the drive unit for emulating the ripple of the input current of the inverter. The DC voltage converter and possibly also other units directly electrically connected to the intermediate circuit are inactive for this purpose, i.e. no current flows through the DC voltage converter and the other units directly electrically connected to the intermediate circuit.

The electrical load is in this case controlled by the inverter on the basis of a switching pattern. For example, for controlling an electrical load embodied as a three-phased electric motor, the inverter may be controlled on the basis of a so-called space vector modulation, which is based on a pulse width modulation. The ripple of the input current of the inverter may be emulated using a model of the inverter and of the electric motor over the duration of a voltage vector, the duration of a voltage vector depending on a switching frequency of the space vector modulation.

The dynamic intermediate circuit model comprises resistances and inductances in all cables that are electrically connected to the intermediate circuit, and electrical capacitances in all intermediate circuit capacitors, which are associated with the respective electric units directly electrically connected to the intermediate circuit. Dynamic is to be understood in the sense that the model parameters are dynamic and dependent on frequency. To make it possible to determine the electrical capacitance on the basis of the dynamic intermediate circuit model, the ripple of the voltage in the intermediate circuit detected by the DC voltage converter and the emulated ripple of the input current of the inverter must be synchronized. This synchronization may be performed for example in that the ripple of the voltage in the intermediate circuit detected by the DC voltage converter is synchronized with a voltage measured by the inverter in the intermediate circuit. For the purpose of controlling the electrical load, the voltage in the intermediate circuit is also measured by the inverter using a sampling process, this sampling process on the part of the inverter having a lower sampling frequency than the sampling process performed by the DC voltage converter. Sampling by the inverter is not suitable for emulating the ripple of the voltage in the intermediate circuit.

The dynamic intermediate circuit model may be adjusted by measurements of the voltage in the intermediate circuit or determined by a change factor of the electrical capacitance in the intermediate circuit or of the ripple of the voltage in the intermediate circuit.

The adjustment of the dynamic intermediate circuit model may be performed if there is a sufficient electrical capacitance in the intermediate circuit. In the process, it is possible to adjust the capacitance in the intermediate circuit, the inductances and resistances in all cables that are electrically connected to the intermediate circuit.

For example, the dynamic intermediate circuit model may be adjusted by comparing capacitances in the intermediate circuit, which are obtained by repeated implementations of the method of the present invention. Alternatively, the dynamic intermediate circuit model may be adjusted by comparing ripples of the voltage in the intermediate circuit, which are obtained by repeated implementation of the method of the present invention while a ripple of the input current of the inverter remains the same. At a lower electrical capacitance in the intermediate circuit, the ripple of the voltage in the intermediate circuit increases. It is also possible, however, for the dynamic intermediate circuit model to be adjusted by a comparison of ripples of the input current of the inverter, which are obtained by repeated implementations of the method of the invention while the ripple of the voltage in the intermediate circuit remains the same.

An amplitude of the detected ripple of the voltage in the intermediate circuit may be stored in a storage medium. The stored amplitude of the detected ripple of the voltage in the intermediate circuit may be used for adjusting the intermediate circuit model. The storage medium is to be understood as a medium that is suitable for storing data. A storage medium may be a memory card. A cloud storage device, in which data may be stored online, is also conceivable. It is also possible to store information about capacitances in the intermediate circuit of other electric drive systems in the cloud storage device. This information may be used for the adjustment of the dynamic intermediate circuit model.

According to another advantageous development of the present invention, the method of the invention comprises the following steps:
  detecting a change in the voltage in the intermediate circuit in a time span when measuring the voltage in the intermediate circuit using the DC voltage converter;
  measuring a charging or discharging current of the intermediate circuit in the time span;
  determining the electrical capacitance in the intermediate circuit on the basis of the voltage change in the intermediate circuit detected in the time span and of the charging or discharging current measured in the time span with the aid of the equation $$I=C*du/dt$$

I is the charging or discharging current of the intermediate circuit and C is the capacitance to be determined in the intermediate circuit. du/dt designates the voltage change in the intermediate circuit in the time span.

The electric drive system in this context may have at least one second electrical energy source, which is electrically connected to the intermediate circuit via the DC voltage converter. In this case, the intermediate circuit may be charged by the second electrical energy source via the DC voltage converter, and the first electrical energy source is switched off when charging the intermediate circuit up to a predetermined voltage level.

The intermediate circuit may also be discharged via the DC voltage converter. If the second electrical energy source is an electrical energy store, then the second electrical energy source may be charged by the discharge current of the intermediate circuit via the DC voltage converter.

When determining the electrical capacitance in the intermediate circuit, it suffices to take into account only a start value and an end value of the measured voltage in the intermediate circuit in the time span.

The electrical capacitance in the intermediate circuit may be determined multiple times. Subsequently, an average is formed of the repeatedly determined electrical capacitance in the intermediate circuit. The repeated determination of the electrical capacitance in the intermediate circuit occurs in a charging or discharging process.

The electrical capacitance in the intermediate circuit advantageously may be determined as a function of the temperature. This allows for additional information to be obtained about the aging of the intermediate circuit capacitors in the intermediate circuit, which are assigned to the respective electric units that are directly electrically connected to the intermediate circuit. Furthermore, using this measurement of the electrical capacitance in the intermediate circuit as a function of the temperature makes it possible to determine or calculate the influence of the temperature on the electrical capacitance in the intermediate circuit.

The method of the present invention makes it possible to determine the electrical capacitance of an intermediate circuit capacitor associated with the inverter. The intermediate circuit in this case may comprise multiple intermediate circuit capacitors, which are respectively assigned to an electric unit that is directly electrically connected to the intermediate circuit. For this purpose, the electrical capacitance of the intermediate circuit capacitor associated with the inverter is significantly greater than the sum of the capacitances of the intermediate circuit capacitors, which are respectively associated with another electric unit that is directly connected to the intermediate circuit.

Furthermore, a motor vehicle is provided, which comprises an electric drive system that is configured for implementing the method of the present invention.

An intermediate circuit usually comprises multiple intermediate circuit capacitors. For example, the intermediate circuit may comprise a first intermediate circuit capacitor, which is associated with an inverter, and a second intermediate circuit capacitor, which is associated with a DC voltage converter. The intermediate circuit may have additional intermediate circuit capacitors, which are associated with additional electric units or loads that are directly electrically connected to the intermediate circuit.

The method according to the present invention makes it possible to utilize the high frequency-sampled voltage measurement of the DC voltage converter of the electric drive system. Thus is is possible to determine the electrical capacitance in the intermediate circuit of the electric drive system in a cost-effective manner.

Since an electrical capacitance of the intermediate circuit capacitor associated with the DC voltage converter as well as electrical capacitances of the intermediate circuit capacitors associated with the further electric units are significantly lower in comparison to the electrical capacitance of the intermediate circuit capacitor associated with the inverter, it is possible to use the method of the present invention to determine the electrical capacitance of the intermediate circuit capacitor associated with the inverter in an approximate manner.

The method of the present invention makes it possible to monitor the state of the intermediate circuit capacitor associated with the inverter continually.

Advantageously, the method of the present invention makes it possible to ascertain an aging mechanism of the intermediate circuit capacitor associated with the inverter by collecting measuring signals such as voltages, currents and temperatures.

The method of the present invention further makes it possible to adapt the parameters of a control process, such as e.g. a current control, to the state of the intermediate circuit capacitor associated with the inverter in order to extend the service life of the intermediate circuit capacitor associated with the inverter.

Moreover, the method of the present invention makes it possible to configure the intermediate circuit capacitor associated with the inverter to be smaller, thus avoiding an oversizing of the intermediate circuit capacitor associated with the inverter. Consequently, the manufacturing costs as well as the space of the intermediate circuit capacitor associated with the inverter and/or of the inverter are reduced.

Specific embodiments of the present invention are explained in detail in the following description with reference to the drawing.

Identical or similar elements are designated by the same reference numerals in the following description of the specific embodiments of the present invention, a repeated description of these elements being omitted in individual cases. The figures represent the subject matter of the present invention only schematically.

BRIEF DESCRIPTION OF THE DRAWING

FIG. 1 shows a schematic representation of an electric drive system, which is configured to determine an electrical capacitance in an intermediate circuit.

DETAILED DESCRIPTION

FIG. 1 shows a schematic representation of an electric drive system 100, which is configured to determine an electrical capacitance in an intermediate circuit 2.

The electric drive system 100 comprises a first electrical energy source 10, which is electrically connected to an intermediate circuit 2 via a main switch 12 and which feeds intermediate circuit 2. The first electrical energy source 10 may be developed as an energy store such as a battery, in particular a lithium-ion battery (LIB), a super capacitor (SC) or a hybrid super capacitor (HSC). First electrical energy source 10, however, may also be developed as an energy converter such as a fuel cell, for example.

The electric drive system 100 further comprises a drive unit 80, which has an inverter 20 and an electrical load 30, the inverter 20 being electrically connected on the input side to intermediate circuit 2.

On the output side, inverter 20 is electrically connected to electrical load 30. Depending on the electrical load 30 electrically connected to inverter 20, inverter 20 is developed to be single-phased or three-phased. Electrical load 30 may be developed as a three-phased electric motor.

Electric drive system 100 furthermore comprises a DC voltage converter 40, which is electrically connected to intermediate circuit 2 and which measures a voltage in intermediate circuit 2 by high frequency sampling.

Electric drive system 100 furthermore has a second electrical energy source 50, which is electrically connected to intermediate circuit 2 via DC voltage converter 40. The second electrical energy source 50 may be developed as an energy store such as a battery, in particular a lithium-ion battery (LIB), a super capacitor (SC) or a hybrid super capacitor (HSC). First electrical energy source 10, however, may also be developed as an energy converter such as a fuel cell, for example.

First electrical energy source 10 and second electrical energy source 50 have different voltage levels. First electrical energy source 10 may have a higher voltage level than second electrical energy source 50.

Electric drive system 100 furthermore comprises a first additional electrical load 60, which is electrically connected to DC voltage converter 40 and via the latter is electrically connected to intermediate circuit 2. The first additional electrical load 60 is to be understood as a group of electric units.

The electric drive system 100 further comprises a second additional electrical load 70, which is directly electrically connected to intermediate circuit 2. The second additional electrical load 70 is likewise to be understood as a group of electric units.

Intermediate circuit 2 in this case comprises multiple intermediate circuits capacitors, which are respectively associated with inverter 20, DC voltage converter 40 and the second additional electrical load 70.

To determine the electrical capacitance in intermediate circuit 2, DC voltage converter 40 measures a voltage in intermediate circuit 2 by high frequency sampling.

According to one advantageous development of the present invention, a ripple of the voltage in intermediate circuit 2 is detected when the voltage in intermediate circuit 2 is measured using DC voltage converter 40. To be able to detect a ripple of the voltage in intermediate circuit 2, the frequency of sampling may be greater than 10 kHz.

A ripple of an input current of inverter 20 is emulated with the aid of a model of drive unit 80. In this instance, no other electric unit such as DC voltage converter 40 or second additional electrical load 70 is active.

A current of electrical load 30 is measured in the process, the measured values of the current of electrical load 30 serving as a starting point for the model of drive unit 80 for emulating the ripple of the input current of inverter 20.

Electrical load 30 may be controlled by inverter 20 on the basis of a switching pattern. For example, the electrical load 30, which is developed as a three-phased electric motor, may be controlled by inverter 20 on the basis of a so-called space vector modulation, which is based on a pulse width modulation. The ripple of the current of the electric motor may be emulated with the aid of a model of inverter 20 and of the electric motor over the duration of a voltage vector, the duration of a voltage vector depending on a switching frequency of the space vector modulation.

After the ripple of the voltage in intermediate circuit 2 is detected and the ripple of the input current of inverter 20 is emulated, the electric capacitance in intermediate circuit 2 is determined on the basis of a dynamic intermediate circuit model. The dynamic intermediate circuit model comprises resistances and inductances in all cables that are electrically connected to intermediate circuit 2, and electrical capacitances in all intermediate circuit capacitors, which are associated with the respective electric units, presently inverter 20, DC voltage converter 40 and the second additional electrical load 70, directly electrically connected to intermediate circuit 2. To make it possible to determine the electrical capacitance in intermediate circuit 2 on the basis of the dynamic intermediate circuit model, the ripple of the voltage in intermediate circuit 2 detected by the DC voltage converter and the emulated ripple of the input current of inverter 20 must be synchronized. This synchronization may be performed for example in that the ripple of the voltage in intermediate circuit 2 detected by DC voltage converter 40 is synchronized with a voltage measured by inverter 20 in intermediate circuit 2. For the purpose of controlling electrical load 30, the voltage in intermediate circuit 2 is also measured by inverter 20 using a sampling process, this sampling process on the part of inverter 20 having a lower sampling frequency than the sampling process performed by DC voltage converter 40. Sampling by inverter 20 is not suitable for emulating the ripple of the voltage in intermediate circuit 2.

The dynamic intermediate circuit model may be adjusted by measurements of the voltage in intermediate circuit 2 or determined by a change factor of the electrical capacitance in intermediate circuit 2 or of the ripple of the voltage in intermediate circuit 2. The adjustment of the dynamic intermediate circuit model may be performed if there is a sufficient electrical capacitance in intermediate circuit 2. At a lower electrical capacitance in intermediate circuit 2, the ripple of the voltage in intermediate circuit 2 increases.

An amplitude of the detected ripple of the voltage in intermediate circuit 2 may be stored in a storage medium. The stored amplitude of the detected ripple of the voltage in intermediate circuit 2 may be used for adjusting the dynamic intermediate circuit model. A storage medium may be a memory card. A cloud storage device, in which data may be stored online, is also conceivable. It is also possible to store information about capacitances in intermediate circuit 2 of other electric drive systems 100 in the cloud storage device. This information may be used for the adjustment of the dynamic intermediate circuit model.

According to another advantageous development of the present invention, a change in the voltage in intermediate circuit 2 within a time span is detected when the voltage in intermediate circuit 2 is measured by DC voltage converter 40.

For this purpose, a charging or discharging current of intermediate circuit 2 is measured in the time span. Intermediate circuit 2 may be charged by second electrical energy source 50 via DC voltage converter 40, and first electrical energy source 10 is disconnected from intermediate circuit 2 by main switch 12 when charging intermediate circuit 2 up to a predetermined voltage level.

Intermediate circuit 2 may also be discharged via DC voltage converter 40. If the second electrical energy source 50 is an electrical energy store, then second electrical energy source 50 may be charged by the discharge current of intermediate circuit 2 via DC voltage converter 40.

The electrical capacitance in intermediate circuit 2 is determined on the basis of the voltage change in intermediate circuit 2 detected in the time span and of the charging or discharging current measured in the time span with the aid of the equation $$I = C * du/dt.$$

I is the charging or discharging current of intermediate circuit 2 and C is the capacitance to be determined in intermediate circuit 2. du/dt designates the voltage change in intermediate circuit 2 in the time span.

Electric drive system 100 may be an electric drive system of a motor vehicle, in particular of an electric or hybrid vehicle.

Electrical load 30 is here developed as an electric motor such as e.g. a traction motor. First electrical energy source 10 may be developed as an energy store such as for example a traction battery or as an energy converter such as a fuel cell, for example. First electrical energy source 10 may have for example a voltage level of 48 volts or even higher. Second electrical energy source 50 may be for example a battery having a low voltage such as e.g. a 12V battery.

First additional electrical load 60 may include for example entertainment devices such as radios, video screens.

Second additional electrical loads 70 may include for example a heating system, a ventilation system and an air conditioning system.

Intermediate circuit 2 is charged when the motor vehicle is started. A time span of the charging process is considered. Within the time span of charging, a voltage in intermediate circuit 2 is measured by DC voltage converter 40. Together with a charging current of intermediate circuit 2 measured in the time span of charging, it is possible to determine the electrical capacitance in intermediate circuit 2.

By contrast, when the motor vehicle is shut down, intermediate circuit 2 is discharged. A time span of the discharging process is considered. Within the time span of discharging, a voltage in intermediate circuit 2 is measured by DC voltage converter 40. Together with a discharging current of intermediate circuit 2 measured in the time span of discharging, it is possible to determine the electrical capacitance in intermediate circuit 2.

When determining the electrical capacitance in intermediate circuit 2, it suffices to take into account only a start value and an end value of the measured voltage in intermediate circuit 2 in the time span.

The electrical capacitance in intermediate circuit 2 may be determined multiple times. Subsequently, an average is formed of the repeatedly determined electrical capacitance in intermediate circuit 2. The repeated determination of the electrical capacitance in intermediate circuit 2 occurs in the charging or discharging process.

The electrical capacitance in intermediate circuit 2 advantageously may be determined as a function of the temperature. This allows for additional information to be obtained about the aging of the intermediate circuit capacitors in intermediate circuit 2, which are assigned to the respective electric units that are directly electrically connected to intermediate circuit 2. Furthermore, using this measurement of the electrical capacitance in intermediate circuit 2 as a function of the temperature makes it possible to determine or calculate the influence of the temperature on the electrical capacitance in intermediate circuit 2.

The electrical capacitance in intermediate circuit 2 may be determined as a function of the temperature in particular when starting the motor vehicle, if the motor vehicle has been standing for a sufficient extent of time. In this case, the temperature of intermediate circuit 2 or of the intermediate circuit capacitors in intermediate circuit 2 equals that of the coolant or that of the surroundings.

Since the electrical capacitance of the intermediate circuit capacitor associated with DC voltage converter 40 as well as the electrical capacitance of the intermediate circuit capacitor associated with the second additional electrical load 70 are significantly lower in comparison to the electrical capacitance of the intermediate circuit capacitor associated with inverter 20, it is possible to us the method of the present invention to determine approximately the electrical capacitance of the intermediate circuit capacitor associated with inverter 20.

The present invention is not restricted to the exemplary embodiments described here and the aspects emphasized therein. Instead, a multitude of variations that lie within the scope of the actions of one skilled in the art are possible within the framework indicated by the descriptions herein.

What is claimed is:

1. A method for determining an electrical capacitance in an intermediate circuit of an electric drive system, the method comprising:
   measuring a voltage in the intermediate circuit with a DC voltage converter, wherein the electric drive system includes:
      at least one first electrical energy source, which feeds the intermediate circuit,
      a drive unit, which includes an inverter and an electrical load, the inverter being electrically connected on the input side to the intermediate circuit and on the output side to the electrical load, and
      the DC voltage converter, which is electrically connected to the intermediate circuit and which measures the voltage in the intermediate circuit by high frequency sampling;
   determining the electrical capacitance in the intermediate circuit based on the voltage in the intermediate circuit as measured by the DC voltage converter;
   detecting a ripple of the voltage in the intermediate circuit;
   measuring a current of the electrical load;
   emulating the ripple of an input current of the inverter based on the measured current of the electrical load; and
   determining the electrical capacitance in the intermediate circuit based on the detected ripple and the emulated ripple.

2. The method of claim 1, wherein the ripple of the voltage in the intermediate circuit is detected when measuring the voltage in the intermediate circuit using the DC voltage converter,
   wherein the ripple of the input current of the inverter is emulated based on the measured current of the electrical load and with a model of the drive unit, and
   wherein the electrical capacitance in the intermediate circuit is determined based on the detected ripple of the voltage in the intermediate circuit and the emulated ripple of the input current of the inverter with a dynamic intermediate circuit model.

3. The method of claim 2, wherein the dynamic intermediate circuit model is adjusted by measurements of the voltage in the intermediate circuit or determined by a change factor of the electrical capacitance in the intermediate circuit or of the ripple of the voltage in the intermediate circuit.

4. The method of claim 2, wherein an amplitude of the detected ripple of the voltage in the intermediate circuit is stored in a storage medium.

5. The method of claim 1, further comprising:
   detecting a change in the voltage in the intermediate circuit in a time span when measuring the voltage in the intermediate circuit using the DC voltage converter;
   measuring a charging or discharging current of the intermediate circuit in the time span; and
   determining the electrical capacitance in the intermediate circuit based on the voltage change in the intermediate circuit detected in the time span and of the charging or discharging current measured in the time span.

6. The method of claim 5, wherein the electric drive system has at least one second electrical energy source, which is electrically connected to the intermediate circuit via the DC voltage converter.

7. The method of claim 5, wherein the electrical capacitance in the intermediate circuit is determined multiple times and an average of the repeatedly determined electrical capacitance in the intermediate circuit is formed.

8. The method of claim 5, wherein the electrical capacitance in the intermediate circuit is determined as a function of the temperature.

9. The method of claim 1, wherein the electrical capacitance of an intermediate circuit capacitor associated with the inverter is determined.

10. A motor vehicle, comprising:
    an electric drive system, wherein an electrical capacitance in an intermediate circuit of the electric drive system is determined by performing the following:
       measuring a voltage in the intermediate circuit with a DC voltage converter, wherein the electric drive system includes:
          at least one first electrical energy source, which feeds the intermediate circuit,
          a drive unit, which includes an inverter and an electrical load, the inverter being electrically connected on the input side to the intermediate circuit and on the output side to the electrical load, and the DC voltage converter, which is electrically connected to the intermediate circuit and which measures the voltage in the intermediate circuit by high frequency sampling; and determining the electrical capacitance in the intermediate circuit based on the voltage in the intermediate circuit as measured by the DC voltage converter;

detecting a ripple of the voltage in the intermediate circuit;

measuring a current of the electrical load;

emulating the ripple of an input current of the inverter based on the measured current of the electrical load; and determining the electrical capacitance in the intermediate circuit based on the detected ripple and the emulated ripple.

11. The motor vehicle of claim 10, wherein the ripple of the voltage in the intermediate circuit is detected when measuring the voltage in the intermediate circuit using the DC voltage converter, wherein the ripple of the input current of the inverter is emulated based on the measured current of the electrical load and with a model of the drive unit, and wherein the electrical capacitance in the intermediate circuit is determined based on the detected ripple of the voltage in the intermediate circuit and the emulated ripple of the input current of the inverter with a dynamic intermediate circuit model.

12. The motor vehicle of claim 11, wherein the dynamic intermediate circuit model is adjusted by measurements of the voltage in the intermediate circuit or determined by a change factor of the electrical capacitance in the intermediate circuit or of the ripple of the voltage in the intermediate circuit.

13. The motor vehicle of claim 11, wherein an amplitude of the detected ripple of the voltage in the intermediate circuit is stored in a storage medium.

14. The motor vehicle of claim 10, wherein the electrical capacitance in the intermediate circuit of the electric drive system is determined by performing the following further tasks:

detecting a change in the voltage in the intermediate circuit in a time span when measuring the voltage in the intermediate circuit using the DC voltage converter;

measuring a charging or discharging current of the intermediate circuit in the time span; and determining the electrical capacitance in the intermediate circuit based on the voltage change in the intermediate circuit detected in the time span and of the charging or discharging current measured in the time span.

15. The motor vehicle of claim 14, wherein the electric drive system has at least one second electrical energy source, which is electrically connected to the intermediate circuit via the DC voltage converter.

16. The motor vehicle of claim 14, wherein the electrical capacitance in the intermediate circuit is determined multiple times and an average of the repeatedly determined electrical capacitance in the intermediate circuit is formed.

17. The motor vehicle of claim 14, wherein the electrical capacitance in the intermediate circuit is determined as a function of the temperature.

18. The motor vehicle of claim 10, wherein the electrical capacitance of an intermediate circuit capacitor associated with the inverter is determined.

* * * * *